(12) United States Patent
Droz

(10) Patent No.: US 9,367,789 B2
(45) Date of Patent: Jun. 14, 2016

(54) PROCESS FOR THE PRODUCTION OF AN ELECTRONIC CARD HAVING AN EXTERNAL CONNECTOR AND SUCH AN EXTERNAL CONNECTOR

(71) Applicant: Nagravision S.A., Cheseaux-sur-Lausanne (CH)

(72) Inventor: François Droz, Corcelles (CH)

(73) Assignee: Nagravision S.A., Cheseaux-sur-Lausanne (CH)

(*) Notice: Subject to any disclaimer, the term of this patent is extended or adjusted under 35 U.S.C. 154(b) by 0 days.

(21) Appl. No.: 14/401,475

(22) PCT Filed: May 16, 2013

(86) PCT No.: PCT/EP2013/060167
§ 371 (c)(1),
(2) Date: Nov. 14, 2014

(87) PCT Pub. No.: WO2013/171314
PCT Pub. Date: Nov. 21, 2013

(65) Prior Publication Data
US 2015/0144703 A1    May 28, 2015

(30) Foreign Application Priority Data
May 16, 2012   (EP) .................................. 12168338

(51) Int. Cl.
*G06K 19/06* (2006.01)
*G06K 19/077* (2006.01)

(52) U.S. Cl.
CPC .... *G06K 19/07743* (2013.01); *G06K 19/07747* (2013.01); *G06K 19/07754* (2013.01); *G06K 19/07769* (2013.01); *G06K 19/07775* (2013.01); *Y10T 29/49018* (2015.01)

(58) Field of Classification Search
CPC .......... H01L 2924/00014; H01L 2924/00013; H01L 2224/05609; H01L 2224/05639; H01L 2224/05644; H01L 2224/05647; H01L 2224/05684; H01L 2224/131; H01L 2224/81815; H01L 2924/014; H01L 2924/15153

USPC .......................................................... 235/492
See application file for complete search history.

(56) References Cited

U.S. PATENT DOCUMENTS 5,260,518 A    11/1993   Tanaka et al.
5,767,503 A     6/1998   Gloton
(Continued)

FOREIGN PATENT DOCUMENTS

DE    197 32 645 A1    9/1998
DE    198 09 073 A1    9/1999
(Continued)

OTHER PUBLICATIONS

International Search Report issued in related application PCT/EP2011/072138, completed Jun. 27, 2012 and mailed Jul. 5, 2012.
(Continued)

*Primary Examiner* — Thien M Le
*Assistant Examiner* — Tae Kim
(74) *Attorney, Agent, or Firm* — Oblon, McClelland, Maier & Neustadt, L.L.P.

(57) ABSTRACT

The invention relates to an external connector for the production of an electronic card comprising an insulating support that defines an outside face and an inside face opposite one another and a plurality of external metal contact pads. This external connector additionally comprises a plurality of metal projections located on the side of the inside face of the insulating support and respectively connected electrically to at least one subassembly of the plurality of external metal contact pads and/or to contact pads linked to an electronic unit, which is arranged on the inside face of the insulating support, wherein these metal projections are intended to be inserted into individual cavities of the body of the electronic card, and metal contact pads linked to an electronic unit inside the card body and/or an antenna incorporated in this card body are located at the base of these cavities. The invention also relates to a process for the production of an electronic card using the aforementioned external connector.

21 Claims, 4 Drawing Sheets

(56) References Cited

U.S. PATENT DOCUMENTS

| | | | |
|---|---|---|---|
| 5,975,420 A | 11/1999 | Gogami et al. | |
| 7,304,247 B2 | 12/2007 | Birgel et al. | |
| 2005/0150682 A1 | 7/2005 | Cohn et al. | |
| 2007/0139977 A1 | 6/2007 | Desai et al. | |
| 2009/0321126 A1 | 12/2009 | Chandrasekraran | |
| 2012/0112361 A1* | 5/2012 | Han et al. | 257/774 |

FOREIGN PATENT DOCUMENTS

| | | |
|---|---|---|
| EP | 0 818 752 A2 | 1/1998 |
| EP | 2 001 007 A2 | 12/2008 |
| EP | 2 296 109 A1 | 3/2011 |
| GB | 2 371 264 A | 7/2002 |
| JP | 2009-182212 A | 8/2009 |
| WO | 97/34247 A2 | 9/1997 |
| WO | 03/017196 A1 | 2/2003 |

OTHER PUBLICATIONS

Office Action issued in co-pending related U.S. Appl. No. 13/991,751 on May 14, 2015.

International Search Report issued in corresponding application PCT/EP2013/060167, completed Jul. 5, 2013 and mailed Jul. 15, 2013.

* cited by examiner

PROCESS FOR THE PRODUCTION OF AN ELECTRONIC CARD HAVING AN EXTERNAL CONNECTOR AND SUCH AN EXTERNAL CONNECTOR

This is a National Phase Application in the United States of International Patent Application PCT/EP 2013/060167 filed May 16, 2013, which claims priority on European Patent Application No. 12168338.7 of May 16, 2012

TECHNICAL FIELD

The present invention relates to the field of electronic cards, in particular bank cards, having an electronic unit and/or an antenna incorporated in the body of this card and an external connector arranged in a cavity in this card body, wherein this connector has a plurality of external contact pads arranged on an outside face of an insulating support forming this connector. The electronic unit and/or an antenna is/are electrically connected to a plurality of internal metal contact pads of the card body, which are arranged under the external connector and which are respectively electrically connected to at least one subassembly of the plurality of external contact pads and/or to contact pads linked to a second electronic unit arranged on the inside face of the connector and located in said cavity by electrical junctions, each comprising a solder joint on the side of the corresponding internal metal contact pad in order to assure a soldered contact to same.

TECHNOLOGICAL BACKGROUND

An electronic card, in which an antenna is incorporated, as well as a process for the production of such a card are known from the document DE 197 32 645. In a particular embodiment of this process shown in part in FIGS. 3A-3C and 4A-4C, the antenna is formed by a plane coil with a metal wire of circular section. In general, the diameter of such a wire is very small (100 to 150 microns). In order to connect the two ends of the antenna to an electronic unit, it is firstly provided that two holes are made in the card body to a depth corresponding to a median plane of these two ends, and these two holes have a diameter that is substantially equal to that of the antenna wire. The two holes are then filled with a conductive glue or a solder material. The manner in which the conductive glue or the solder material are applied into the two holes of small diameter is not explained anywhere in this document DE 197 32 645. This step of the process is not in fact obvious. How to insert the glue or the solder material into such small holes in an industrial production? Firstly, there is a question of the precise positioning of a nozzle or needle serving to apply the glue or solder material. Then, how to allow the air that is initially present in the holes to escape during the insertion of the glue or the solder material? The answer to this question is important, since an electrical connection must be assured via these holes. A person skilled in the art will not find an answer in the document in question and in fact the answer is not obvious, since air is generally trapped by the glue or the solder material inserted through the aperture. A kind of plug is thus formed that traps the air at the bottom of each hole and the rest of the material applied then spreads over the plane surface on the periphery of the holes. It is clear that such a situation is particularly disadvantageous when the holes are close because of the increased risk of short-circuiting. Hence, a person skilled in the art will consider the configuration of an electronic card according to FIGS. 3A-3C and 4A-4C of the document DE 197 32 645 very difficult, or indeed practically impossible, to implement.

An electronic card is known from document WO 97/34247, wherein the solder material provided between the respective contact pads to form the electrical connections is inserted into an adhesive film. The solder material is incorporated in particular into apertures formed in this adhesive film (see FIGS. 8 to 10), which is then applied to a shoulder arranged in the cavity provided for an electronic module in such a manner that the apertures filled with solder materials are aligned on internal contact pads that are visible on the surface of the shoulder. The electronic module is arranged such that the solder material also faces contact pads arranged on the inside face of an insulating support of this module. Finally, the glue is activated and the solder material is melted by a supply of heat through the insulating support. It will be noted that the application of solder material in the apertures of an adhesive film before this is assembled on the electronic module or card body poses problems of production, since it is not obvious how to hold the solder material in the apertures of the adhesive film until the electronic module is assembled with the card body. Thus, in a variant it is provided to introduce conductive particles into an adhesive film into the zones provided for the solder joints.

SUMMARY OF THE INVENTION

The aim of the present invention is to remedy the disadvantages of the aforementioned prior art and to firstly propose a process for the production of electronic cards, which each have an external connector with first contact pads securely soldered to second contact pads of an electronic module incorporated in the card body. The particular aim of the invention is to assure the reliability of the electrical connections between the first and second contact pads, in particular when they are relatively high in number, and especially more than four, and to a large extent dissociate the thickness of the insulating support of the external connector and the positioning of said contact pads in the card body and therefore, where necessary, from the internal support on which they are arranged.

The aim of the present invention is also to provide an external connector suitable for the production process of the invention.

On this basis, the present invention relates to a process for the production of an electronic card formed by:
an external connector comprising an insulating support that defines an outside face and an inside face opposite one another and a plurality of external metal contact pads, which are arranged on the outside face of this insulating support;
a card body having a cavity for the external connector;
an electronic unit and/or an antenna incorporated in the card body and electrically connected to or having a plurality of internal metal pads arranged under the cavity.

This production process comprises a step of machining individual cavities in the card body until the internal metal pads are reached or until the metal parts arranged on these internal metal pads and in electrical contact therewith are reached, wherein these metal parts or the internal metal pads can be partially machined, the individual cavities having a cross-section in which at least one dimension is greater than 0.5 mm (500 µm). The production process also comprises the following steps:
forming the external connector with a plurality of metal projections located on the side of the inside face of the insulating support and respectively connected electrically to at least one subassembly of the plurality of external metal contact pads and/or to contact pads linked to a second electronic unit, which is arranged on the inside face of the insulating support and intended to be located in the cavity of the card body, wherein these metal projections are arranged in order to respectively face the individual cavities during the placement of the external connector in the cavity and configured to be capable of being inserted into these individual cavities;

subsequent to forming the external connector and machining individual cavities in the card body, placing this external connector in the cavity of the card body, wherein the metal projections are then inserted into the respective individual cavities in order to fill these at least partially, and the initial volume of each projection is provided such that, once the connector is in place in its cavity, the volume of this projection is substantially equal to or smaller than the volume of the corresponding individual cavity;

supplying energy at least partially to the metal projections to perform soldering at least on the side of the internal metal pads and form soldered contacts between these and the external connector, wherein electrical junctions are thus obtained between the internal metal pads and the at least one subassembly of the plurality of external metal contact pads and/or the contact pads linked to the second electronic unit.

According to a preferred embodiment of the production process of the invention the insulating support has a plurality of apertures between its outside face and its inside face, wherein the apertures of this plurality of apertures are respectively closed by the external pads of the at least one subassembly of the plurality of external metal contact pads on the side of the outside face of the insulating support. The apertures are at least partially filled by respective metal parts, which, with the respective metal projections that surmount them or extend them and after the supply of energy that is supplied to the respective metal projections and also to the metal parts, form metal connecting bridges between the rear surfaces of the respective external pads and the corresponding internal pads, wherein these metal connecting bridges each comprise a solder joint on the side of the rear surface of the corresponding external pad that assures a soldered contact to the latter.

According to a variant of the preferred embodiment the metal connecting bridges are each formed by a solder material that is melted by the supply of heat in order to form the same single solder joint between an internal pad and the rear surface of the corresponding external pad.

The invention also relates in particular to an external connector for the manufacture of an electronic card using the aforementioned process comprising an insulating support that defines an outside face and an inside face opposite one another and a plurality of external metal contact pads, which are arranged on the outside face of this insulating support. This external connector also comprises a plurality of metal projections located on the side of the inside face of the insulating support and respectively connected electrically to at least one subassembly of the plurality of external metal contact pads and/or to contact pads linked to an electronic unit, which is arranged on the inside face of the insulating support, wherein these metal projections are intended to be inserted into individual cavities of the body of the electronic card, and metal contact pads linked to an electronic unit inside the card body and/or an antenna incorporated in this card body are located at the bottom of said cavities.

Other particular features of the invention will be explained below in the detailed description of the invention.

BRIEF DESCRIPTION OF THE DRAWINGS

The invention will be described below on the basis of attached drawings given as non-restrictive examples, wherein.

DETAILED DESCRIPTION OF THE INVENTION

Figure 1:
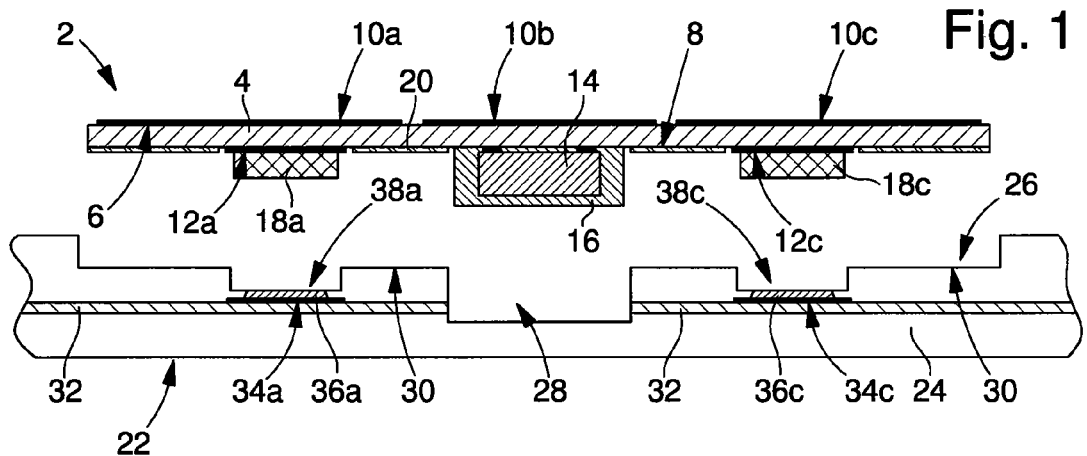
FIGS. 1 to 3 show three successive steps of an exemplary embodiment of the production process according to the invention of an electronic card with an external connector.

The production process according to the invention for an electronic card and the resulting card according to a first embodiment will be described below with the assistance of FIGS. 1 to 4.

The produced electronic card comprises:
an external connector 2 comprising an insulating support 4 and a plurality of external metal contact pads 10a, 10b, 10c, which are arranged on the outside face 6 of this insulating support;
a card body 22 having a cavity 26 for the external connector 2;
an electronic unit and/or an antenna (not shown in the figures) that is/are incorporated in the card body 22 and electrically connected to a plurality of internal metal contact pads 34a, 34c located in the card body under the cavity 26, i.e. under the general surface defining the base of this cavity, which is formed by the recess 28 and the horizontal surface 30 surrounding this recess.

Figure 2:
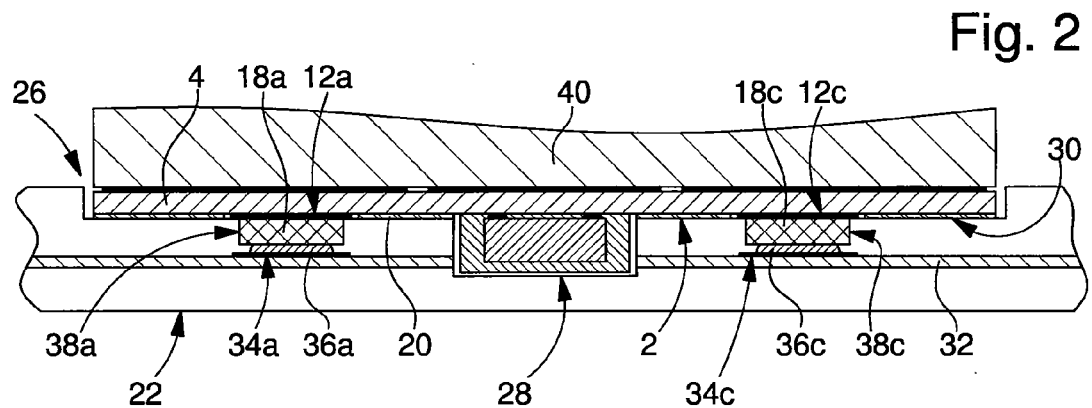

The production process generally comprises the following steps:
machining individual cavities 38a and 38c in the card body 22 at the base of the cavity 26 facing the internal pads 34a, 34c of the plurality of internal metal contact pads to a given depth or until these internal pads are reached or until metal parts 36a, 36c arranged on these internal pads and in electrical contact therewith are truncated and thus define contact surfaces at the base of the individual cavities;

forming the external connector 2 with a plurality of metal projections 18a, 18c located on the side of the inside face 8 of the insulating support 4 and respectively connected electrically to at least one subassembly of the plurality of external metal contact pads and/or to contact pads linked to a second electronic unit 14, which is arranged on the inside face of the insulating support and intended to be located in the cavity 26, wherein these metal projections 18a, 18c are arranged in order to respectively face the individual cavities 38a, 38c during the placement of the external connector in the cavity (situation shown in FIG. 1);

subsequent to said formation of the external connector and the machining of the individual cavities in the card body, placing this external connector in the cavity 26 of the card body, wherein the metal projections are then inserted into the respective individual cavities (situation shown in FIG. 2);

supplying energy at least partially to the metal projections 18a, 18c (FIG. 3) to perform soldering at least on the side of the internal metal pads 34a, 34c to form soldered contacts thereto and form electrical junctions between the internal pads and said at least one subassembly of the plurality of external metal contact pads and/or said contact pads linked to the second electronic unit 14.

It will be observed that the electrical connections between the metal projections and at least one subassembly of the plurality of external metal contact pads and/or the contact pads linked to the second electronic unit 14 are not shown in FIGS. 1 to 4. The electrical connections between the projections and the contacts of the electronic unit can be achieved in the classic manner by conductive tracks deposited on the inside face 8 of the insulating support 4. The external pads are electrically connected to projections and/or contacts of the electronic unit 14 by typical vias, by tracks that descend the side wall of the insulating support 4 or by any other means known to the person skilled in the art. The electronic unit 14 is conventionally protected by a solidified resin 16 covering it.

In a preferred variant the metal projections 18a, 18c are formed by a solder material preferably deposited in paste form. In another variant where these projections are formed by pellets of rigid metal (copper, for example), a solder joint is formed between these pellets and the internal pads 34a, 34c as a result of the presence of the metal parts 36a, 36c formed by a solder material, e.g. tin. Other silver- or gold-based solder materials can be provided in particular.

Figure 4:
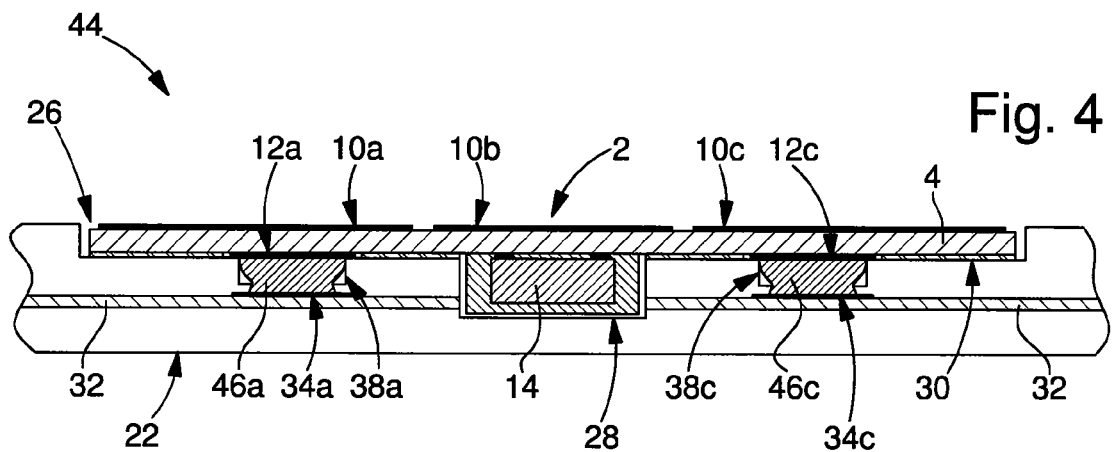
FIG. 4 is a view in partial section of a first embodiment of an electronic card with an external connector according to the invention.
Figure 5:
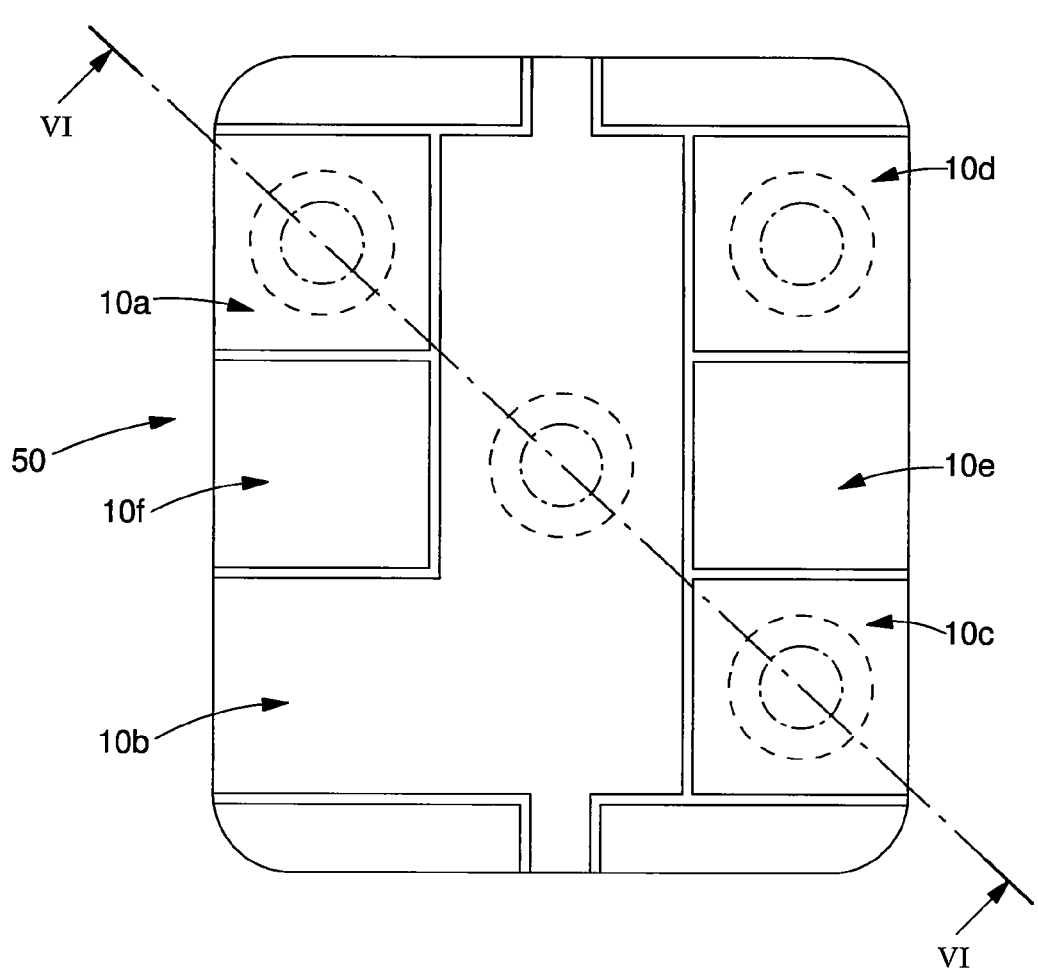
FIG. 5 is a plan view of a preferred embodiment of an external connector according to the invention.

The production process is explained here on the basis of the production of a first embodiment of an electronic card 44 according to the invention, more specifically with a first embodiment of the external connector. According to this first embodiment a plurality of intermediate contact pads 12a, 12c are arranged on the inside face 8 of the external connector 2 and electrically connected to said at least one subassembly of the plurality of external metal contact pads and/or to the contact pads linked to the electronic unit 14. These intermediate contact pads are respectively located to face the inside faces 34a, 34c and the metal material forming the projections is a solder material, which subsequently to the aforementioned supply of energy, forms a solder joint 46a, 46c between each of said internal pads and a corresponding intermediate contact pad of the intermediate contact pads 12a, 12c, as shown in FIG. 4.

In a first variant the solder material forming said projections 18a, 18c is applied in paste form and is then hardened before the external connector is placed in the cavity 26. In another variant the solder material is applied in a molten metal state (liquid state) by means of a heat nozzle. In the latter case a massive solid metal projection is obtained after hardening of the molten metal. In the two variants mentioned a shaping of the projections can be provided by means of a shaping tool applied to the projections and by exerting a shaping pressure on these.

Figure 3:
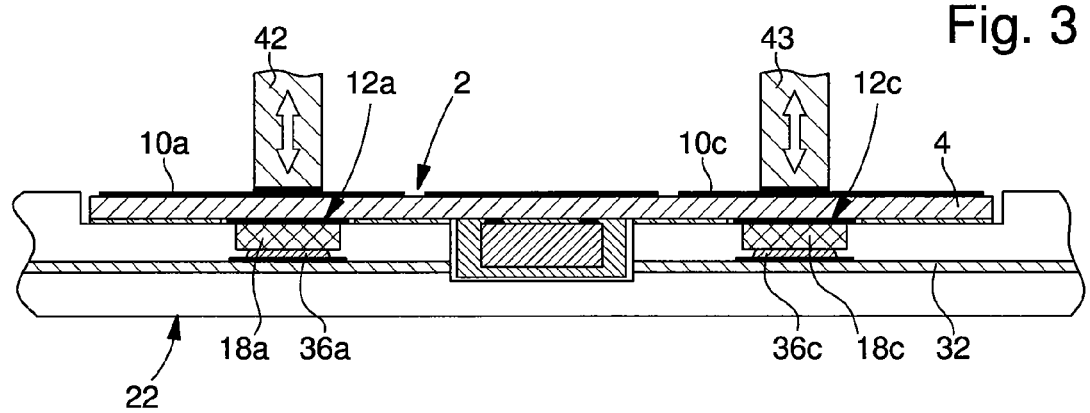

The initial dimensions provided for the projections are preferably such that, subsequent to the placement of the external connector in the cavity, these projections fill the respective individual cavities for the most part, but not completely. This ensures that no solder material can exit from the individual cavities and extend over the surface 30 of the base of the cavity 26, which could otherwise cause short-circuiting. In FIGS. 2 and 3 the solder material forming the projections fills the cavities 38a, 38c completely. This corresponds to another variant where the apportioning of material during the formation of the projections is precisely adjusted. It will be noted that this situation can also result in projections that initially have a thickness that is slightly greater than the depth of the individual cavities. Firstly, the solder material in the form of a dried paste can be crushed during the placement of the external connector in the cavity 26 allowing the solder material to be applied more densely. Secondly, the dimensions provided for the projections in a general plane parallel to the support 4 are smaller than those of the individual cavities 38a, 38c (in the case of cylindrical cavities, the diameter thereof is larger than the diameter of the corresponding projections).

By virtue of the features of the invention, therefore, it is possible to have a relatively large number of internal contact pads connected to as many contact pads of the external connector and to arrange the individual cavities according to the invention close to one another without the risk of short circuits. There is then an independence between the thickness of the insulating support and hence the level/depth of the surface 30 that defines the base of the cavity 26 and the level where the internal contact pads 34a, 34c are arranged in the thickness of the body of the card 22. Finally, the invention allows a relatively significant amount of solder material to be applied per projection to form a solder joint and thus obtain soldered electrical junctions between the internal pads and the corresponding contact pads of the external connector (intermediate pads 12a, 12c in the case of the first embodiment of a card of FIG. 4).

According to a particular variant shown in the figures, it is provided to place an adhesive film 20 on the inside face 8 of said insulating support 4. This adhesive film serves to glue the external connector to the base (surface 30) of the cavity 26 and it has apertures, from which the metal projections 18a, 18c exit. A press 40, by means of which heat can be applied to melt or activate the adhesive film and thus allow the external connector to be glued to the card body, is used to secure the external connector in its cavity. It will be noted that the assembly using glue is an additional means of fastening to the soldered electrical junctions described above.

According to a preferred variant of the production process of the invention the supply of energy provided to form the solder joints is achieved in a substantially localised manner in the respective regions of the metal projections through the plurality of external metal contact pads. In particular, thermodes 42 and 43 shown schematically in FIG. 3 (heating elements can be applied to a surface) are used. It will be noted that the thermodes can be incorporated in the press 40 in order to conduct the gluing and soldering during the same production step.

According to a particular variant of the production process of the invention the solder material forming the metal projections is deposited on the side of the inside face of said insulating support in a thick film screen-printing technique.

According to another particular variant of the production process of the invention the adhesive film 20 is arranged on a non-stick sheet (not shown in the figures), which is located on the other side of said inside face 8 after deposition of the adhesive film on the latter. This adhesive film and the non-stick sheet have apertures traversing the two and filled with solder material, and the non-stick sheet is then removed to obtain the metal projections, which exit from the respective apertures of the adhesive film. The solder material can be applied with a certain surplus, which is removed by a blade that scrapes over the top of the non-stick sheet. The through apertures are thus completely filled with solder material and this solder material has plane surfaces substantially flush with the outside surface of the non-stick sheet.

According to the invention the individual cavities have a cross-section (in the plane of the card body) having at least one dimension larger than 0.5 mm (500 μm). In particular, the cross-section is circular.

According to the variant shown in FIG. 4 the individual cavities 38a, 38c are substantially filled with the metal material that firstly forms the metal projections, then after the provided soldering forms the connecting bridges 46a, 46c between the internal pads 34a, 34c and the intermediate pads 12a, 12c.

According to a preferred variant of the production process of the invention and of the electronic card according to the invention, the internal pads 34a, 34c are arranged on an internal support 32 embedded in the plastic material 24 of the card body, and this internal support comprises or is linked to at least one element for positioning this internal support in the thickness of the card body so that these internal pads are substantially located at a determined level in this card body. This is evident in particular in the case of the production of the card body at least in part with a resin, which is in a liquid or paste-like (soft) state to encase the various electronic elements and units and form this card body. The positioning element or elements is/are not shown in the figures. This/these may be one or more crosspieces, projections or contact points to a press used for the production of the card body or to solid layers of this card body. It/they can be provided on one or more of the elements inserted, in particular on the internal support 32. In the case where at least one solid layer extends in the region provided for the cavity 26, it/they can initially be arranged on this at least one solid layer. This preferred variant is advantageous in an industrial production operation, in which the metal projections are calibrated and thus have uniform dimensions. By virtue of this variant it is possible for a given series of electronic cards to make individual cavities all with the same determined depth, since it can be ensured that the mounds of solder material on the internal contact pads are then all reached and at least partially truncated to produce the envisaged solder joint and form the envisaged electrical junctions. It is, of course, possible to have machining installations that are capable of detecting the metal mounds during the machining of the individual cavities or, in the absence thereof, the internal pads themselves. However, if the height position of these internal pads varies a fair amount in the thickness of the card body more than in acceptable tolerances, then there is the risk that the volume of the individual cavities will no longer correspond to that of the metal projections. If the volume of the latter is smaller than that of the machined cavities, it will certainly be possible to form the cards correctly, since the solder material melted by the supply of energy will tend to join the metal pads facing one another. Conversely, if the volume of the projections arranged on the external connectors is larger than the volume of the individual cavities, at least for some of the produced cards, then there is a substantial risk of the latter being subject to short-circuits due to a surplus of solder material extending outside the individual cavities during the placement of the external connector in its cavity, which is what the invention seeks to avoid.

According to the invention the electronic cards generally obtained are characterised in that the cavity provided for the external connector has a plurality of individual cavities separated by an insulating material forming the card body, and visible at the base of said cavities are the internal pads of a plurality of metal contact pads located in the card body or metal parts arranged on these internal pads and in electrical contact therewith, and in that the individual cavities are at least partially filled with a metal material that forms the electrical junctions between the internal pads and corresponding pads of the external connector.

A second preferred embodiment of the invention and its production process will be described below with the assistance of FIGS. 5 to 8. Some of the elements that have already been described and some of the steps of the production process already explained above will not be explained again in detail below. This second embodiment differs from the first substantially in the arrangement of the external connector, wherein the process of assembly of this external connector on a corresponding card body, in particular the formation of the electrical junctions between them, is similar to that already described.

Figure 6:
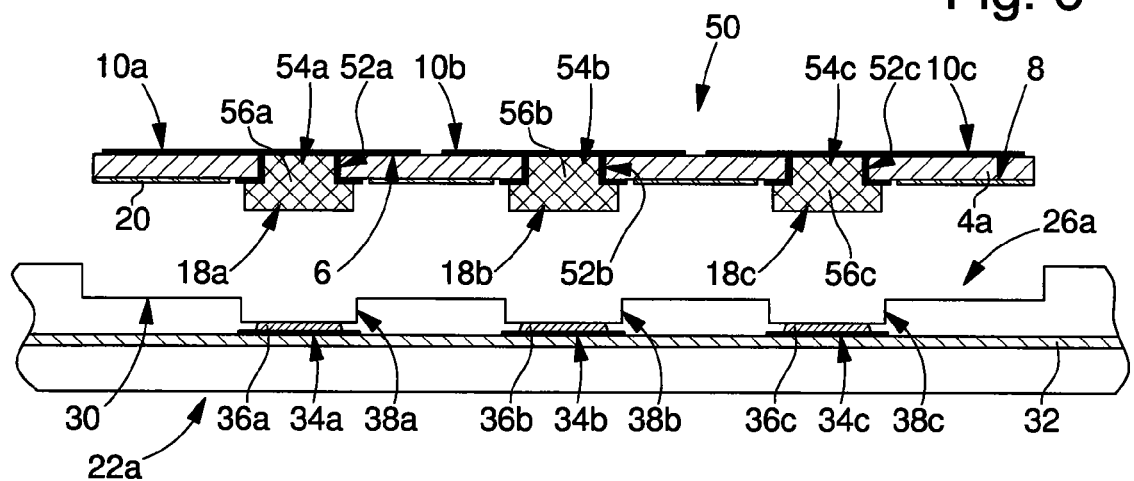
FIG. 6 is a sectional view showing the external connector of FIG. 5 and partially showing the card body in the region of the cavity provided for the connector before their assembly.
Figure 7:
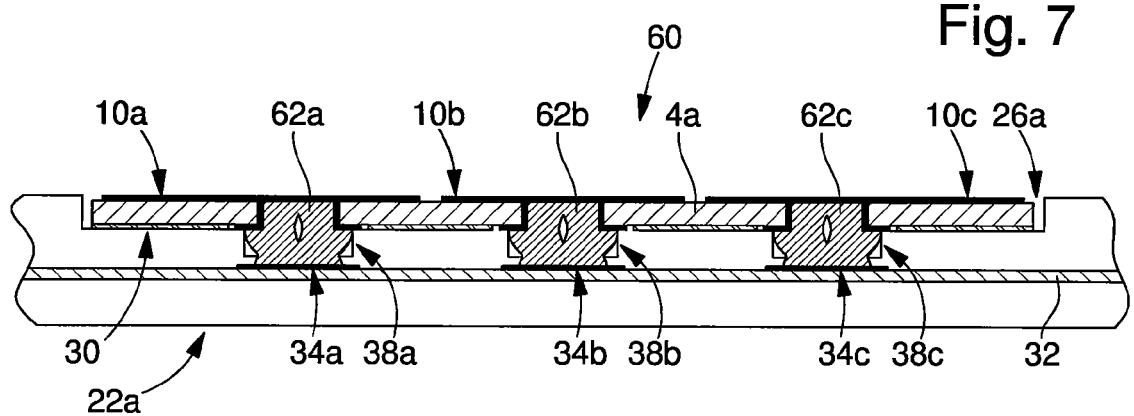
FIG. 7 is a view in partial section of a second preferred embodiment of an electronic card with an external connector according to the invention.

The external connector 50 has a plurality of external contact pads 10a to 10f. It comprises an insulating support 4a, which has a plurality of apertures 52a, 52b, 52c (and a fourth that is not visible in the sectional view of FIG. 6) between its outside face 6 and its inside face 8. The apertures of this plurality of apertures are respectively closed by the external pads 10a, 10b, 10c and 10d forming a subassembly of the plurality of external metal contact pads on the side of the outside face of the insulating support. In general, these apertures are at least partially filled with the respective metal parts 54a, 54b, 54c, which, with said respective projections 18a, 18b, 18c that surmount them or extend them and before the assembly on the card body of the external connector, form metal studs 56a, 56b, 56c, which rise from the rear surfaces of said subassembly of external pads traversing the insulating support 4a (FIG. 6). After placement of the external connector in its cavity 26a of the card body 22a, during which the projections 18a, 18b, 18c penetrate into the respective individual cavities 38a, 38b, 38c, and after the supply of energy that is supplied to these metal studs and to the truncated metal mounds 36a, 36b, 36c, metal connecting bridges 62a, 62b, 62c are formed between the rear surfaces of said external pads and the corresponding internal pads to produce solder joints on the internal pads 34a, 34b, 34c, wherein these metal connecting bridges each comprise a solder joint on the side of the rear surface of the corresponding external pad that assures a soldered contact to the latter. Thus, an electronic card 60 according to the invention such as that shown in partial section in FIG. 7 is obtained. These metal connecting bridges completely define the electrical junctions between the internal pads in question and the corresponding external pads.

It will be observed, in a variant shown in the figures, that the apertures 52a, 52b, 52c have a metal layer forming an adhesive interface on their side wall and this layer can also extend along the periphery of the apertures on the inside face of the insulating support to form metal rings. During the supply of energy to conduct the soldering in particular, the solder material bonds to this metal layer, as shown in FIG. 7. In the variant shown in this figure the apertures in the insulating support 4a are substantially filled by the respective metal connecting bridges.

In a preferred variant the metal studs and the metal connecting bridges obtained subsequently by the production process according to the invention are each formed by a solder material so that the solder joint on the side of the corresponding internal pad and the solder joint on the side of the rear surface of the corresponding external pad are both formed by the same single solder joint that extends between this corresponding internal pad and this rear surface of the corresponding external pad.

According to a particular variant the apertures have a cross-section (in the general plane of the insulating support) that has at least one dimension larger than 0.2 mm (200 µm). In particular, the cross-section is circular. According to a preferred variant the diameter of the apertures is larger than 0.5 mm (500 µm).

According to a particular variant of the production process of the invention the solder material forming the metal projections is deposited on the side of the inside face of the insulating support by a nozzle that receives the solder material from a metering device that allows the quantity of solder material applied to each individual cavity at the base of the cavity of the card body to be controlled precisely. This variant is particularly well suited to the formation of the metal studs in the production of the second embodiment of an electronic card according to the invention, but it can also be used for the production of the first embodiment described above. The deposited solder material can, for example, be in paste form, in the form of molten metal that hardens following the deposition or by the provision of preformed elements. A step of shaping the projections can be provided in order to obtain a given shape and substantially identical dimensions for all the projections. It will be noted that the variants described above for the formation of the metal projections in the framework of the first embodiment can also be used to form the metal studs of the second embodiment. In the case where a screen-printing technique is used, care will be taken that the metal studs have a smaller diameter than that of the apertures 52*a*, 52*b*, 52*c* so that they do not have a projecting collar on their free end.

Figure 8:
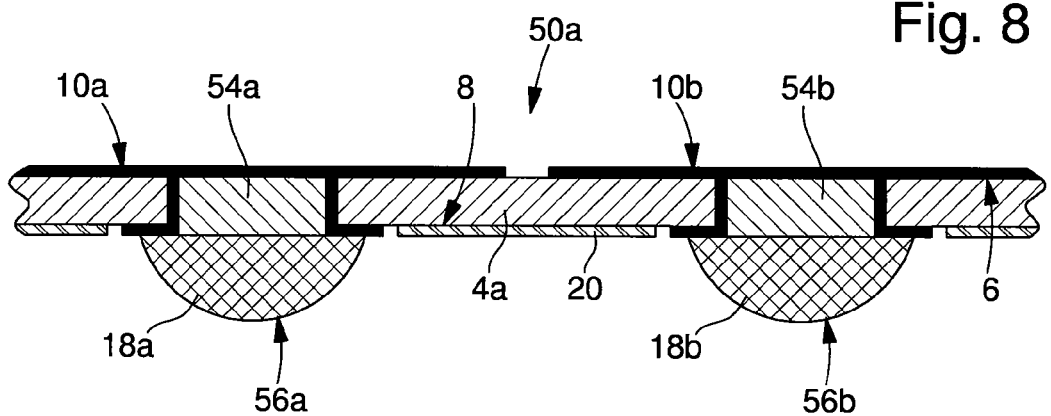
FIG. 8 is a view in partial section of a variant of the connector shown in FIG. 6.

An external connector 50*a*, which is a variant of the connector 50 of FIG. 6, is shown in partial section in FIG. 8. This connector differs in that the metal studs 56*a*, 56*b* are formed by metal parts 54*a*, 54*b* formed from solder material that has already melted once and hardened to form a solid metal without air and/or liquid (solvent). Arranged on these metal parts are the metal projections 18*a*, 18*b* that are formed by a solder material in paste form that has, however, been dried after its deposition on the side of the inside face 8 of the insulating support 4*a*. These projections are deposited by a nozzle and are substantially rounded in shape. Since the individual cavities of the card body are cylindrical, it is provided that the projections initially, before the assembly, have a height greater than the depth of the individual cavities. During the insertion of the projections into the respective cavities the projections are crushed and deformed in order to at least partially fill the respective cavities. After the supply of energy and soldering of the electrical junctions an electronic card 60 such as that shown in FIG. 7 is obtained. It will be noted that the solder materials of the metal parts and the projections can be different or of the same metal material/alloy.

Figure 9:
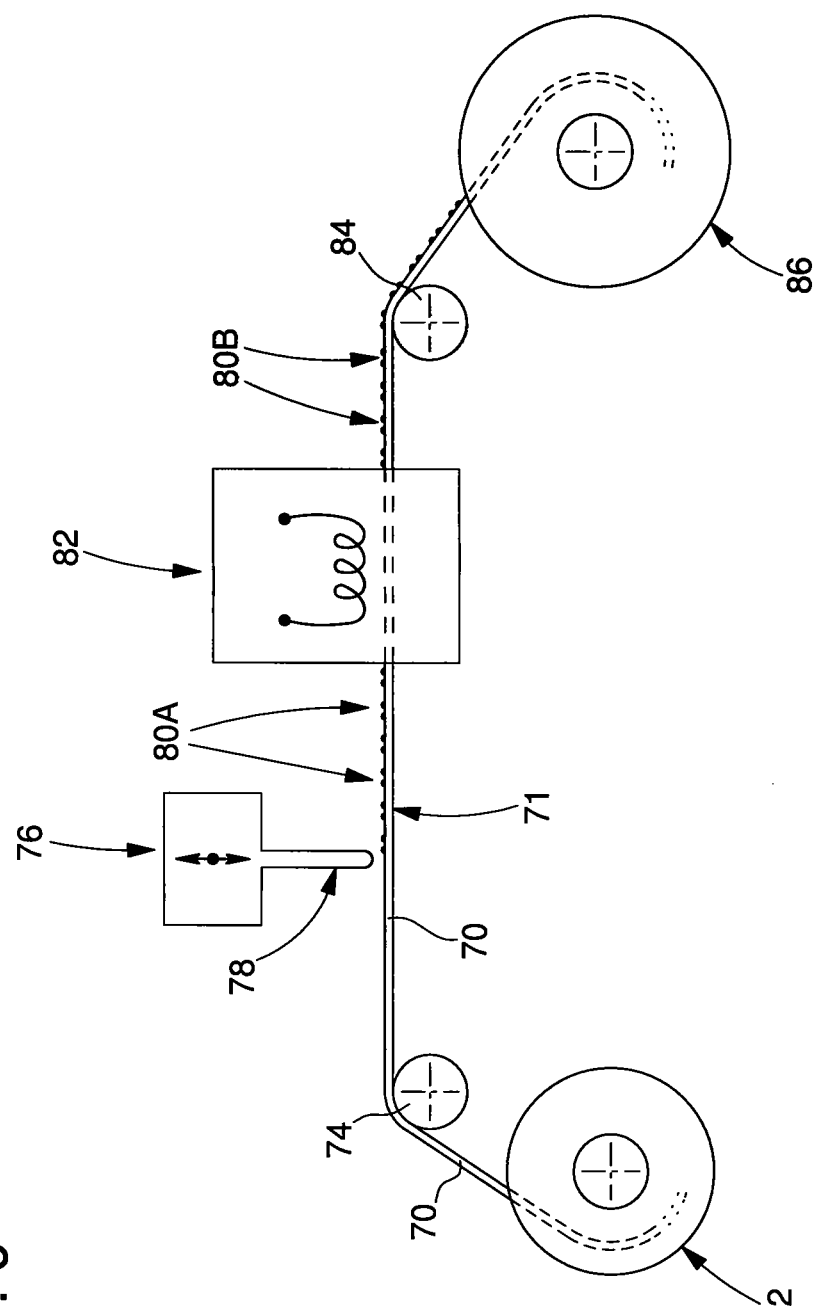
FIG. 9 schematically shows a method of production of a plurality of external connectors according to the invention.

FIG. 9 shows the production of a plurality of external connectors in a strip. The insulating supports of the plurality of connectors are initially formed by a strip 70, which comprises metal contact pads (not shown) on one face 71 and on the other side has intermediate contact pads, each electrically connected to one of the external metal contact pads, and also apertures, which traverse the insulating support as far as the respective rear surfaces of at least one subassembly of said metal contact pads. The strip is firstly wound onto a first coil 72. It is then unwound progressively and after having passed a first roll 74, it runs under a solder material distributor 76 comprising a nozzle or a needle 78, by means of which drops of solder material are deposited onto each of said intermediate contact pads or into each of said apertures. This operation is conducted with precision, the distributor being provided to be mobile in at least one transverse direction to the running direction of the strip 70 in a plane parallel to the latter. This distributor is arranged to deposit precise metered quantities of solder material. According to the invention the solder material defines a plurality of metal projections 80A. In the present case according to a variant of the invention the solder material is deposited in paste form.

The strip 70 with the projections 80A formed from a solder material paste then passes into an oven 82, which serves to dry and harden the solder material. Thus, projections 80B formed from hardened solder material exit from the oven. The oven is, for example, a hot air or uv oven. In a particular variant the supply of heat to the projections is performed in a localised manner by optical diodes. Once the strip has passed through the oven, it is unwound onto a second coil 86 after having passed over a second roll 84. As a result of this, a plurality of external connectors according to the invention can be easily stored before they are used in the production of a plurality of electronic cards, during which the strip 70 with the metal projections 80B is progressively unwound from the storage coil 86 and the external connectors are then cut off from the strip to form individual connectors that are then respectively placed into the cavities of the plurality of cards.

It will be noted that instead of forming the projections using the solder material distributor, a variant provides that the projections are formed by preformed elements, which are applied and positioned on the plurality of connectors on a strip by an automatic installation.

What is claimed is:

1. A process for the production of an electronic card including an external connector comprising an insulating support that defines an outside face and an inside face opposite one another and a plurality of external metal contact pads, which are arranged on the outside face of this insulating support;

a card body having a cavity for the external connector;

at least one of an electronic unit and an antenna incorporated in the card body and electrically connected to or having a plurality of internal metal pads arranged under the cavity;

wherein the process comprises:

machining individual cavities in the card body until the internal metal pads are reached or until metal parts arranged on the internal metal pads and in electrical contact therewith are reached, the metal parts or the internal metal pads being partially machinable, the individual cavities having a cross-section in which at least one dimension is greater than 0.5 mm;

forming the external connector with a plurality of metal projections located on a side of the inside face of the insulating support and respectively connected electrically to at least one subassembly of the plurality of external metal contact pads or to contact pads linked to a second electronic unit, which is arranged on the inside face of the insulating support and being locatable in the cavity, wherein the metal projections are arranged in order to respectively face the individual cavities during the placement of the external connector in the cavity and configured to be insertable into the individual cavities in order to substantially fill the individual cavities;

subsequent to the forming of the external connector and the machining of the individual cavities in the card body, placing the external connector in the cavity of the card body, with the metal projections respectively inserted into the individual cavities, and an initial volume of each projection is provided such that, once the connector is in place in the cavity, the volume of the projection is substantially equal to or smaller than a volume of a corresponding individual cavity;

supplying energy to at least part of the metal projections to perform soldering at least on a side of the internal metal pads and form soldered contacts between the at least part of the metal projections and the external connector, so that electrical junctions are obtained between the internal metal pads and the at least one subassembly of the plurality of external metal contact pads or the contact pads linked to the second electronic unit.

2. The production process according to claim 1, wherein the individual cavities are circular and have a diameter larger than 0.5 mm.

3. The production process according to claim 1, wherein a plurality of intermediate contact pads are arranged on the inside face of the external connector and electrically connected to the at least one subassembly of the plurality of external contact pads or to the contact pads linked to the second electronic unit, wherein the intermediate contact pads are respectively located under the metal projections, and in that the metal projections are formed by a solder material, which subsequent to the supply of energy forms a solder joint between each of the internal metal pads and a corresponding intermediate contact pad of the intermediate contact pads.

4. The production process according to claim 1, wherein the insulating support has a plurality of apertures between an outside face thereof and an inside face thereof, wherein the apertures of the plurality of apertures are respectively closed by the external pads of the at least one subassembly of the plurality of external metal contact pads on a side of the outside face of the insulating support, wherein the apertures are substantially filled by respective metal parts, and wherein with the respective metal projections that surmount the apertures or extend the apertures and after the supply of energy that is supplied to the respective metal projections and also to the metal parts, the metal parts form metal connecting bridges between rear surfaces of the respective external pads and the corresponding internal pads, wherein the metal connecting bridges each comprise a solder joint on a side of the rear surface of the corresponding external pad that assures a soldered contact therebetween.

5. The production process according to claim 4, wherein the apertures are circular and have a diameter larger than 0.5 mm.

6. The production process according to claim 5, wherein each of the metal connecting bridges is formed substantially by a solder material that is melted by the supply of energy in order to form a same single solder joint between an internal pad and a rear surface of a corresponding external pad.

7. The production process according to claim 3, wherein the solder material forming the metal projections is deposited on a side of the rear face of the insulating support using a thick film screen-printing process.

8. The production process according to claim 4, wherein the solder material forming the metal projections is deposited on the side of the rear face of the insulating support by a nozzle or needle that receives the solder material from a metering device allowing a quantity of solder material to be controlled precisely.

9. The production process according to claim 6, wherein an adhesive film is deposited on the inside face of the insulating support, wherein the adhesive film is provided to glue the external connector to a base of the cavity after being applied to the inside face of the insulating support, and the adhesive film is arranged on a non-stick sheet, which is located on an other side of the inside face after deposition of the adhesive film, wherein the film and the non-stick sheet have apertures traversing both; and wherein the apertures are filled with solder material, and the non-stick sheet is then removed to obtain the metal projections, which exit from respective apertures of the adhesive film.

10. The production process according to claim 6, wherein the metal projections are preformed and placed on the side of the rear face of the insulating support by an automatic installation.

11. The production process according to claim 3, wherein the solder material forming the metal projections is applied in paste form and is then hardened before placement of the external connector in the cavity.

12. The production process according to claim 4, wherein the solder material forming the metal projections is applied in paste form and is then hardened before placement of the external connector in the cavity.

13. The production process according to claim 1, wherein initial dimensions provided for the metal projections are such that, subsequent to the placement of the external connector in the cavity, the metal projections substantially fill respective individual cavities.

14. The production process according to claim 1, further comprising depositing an adhesive film on the inside face of the insulating support, wherein the adhesive film serves to glue the external connector to the base of the cavity and has apertures, from which the metal projections exit.

15. The production process according to claim 1, wherein the supply of energy is achieved in a substantially localized manner in respective regions of the metal projections through the plurality of external metal contact pads.

16. An external connector for the production of an electronic card using the process of claim 1, comprising:
an insulating support that defines an outside face and an inside face opposite one another and a plurality of external metal contact pads, which are arranged on the outside face of this insulating support;
a plurality of metal projections located on a side of the inside face of the insulating support and respectively connected electrically to at least one subassembly of the plurality of external metal contact pads or to contact pads linked to an electronic unit, which is arranged on the inside face of the insulating support, wherein the metal projections are insertable into individual cavities of the body of the electronic card, and metal contact pads linked to an electronic unit inside the card body or an antenna incorporated in the card body are located at bottoms of the individual cavities; and wherein the metal projections are configured to be insertable, during placement of the external connector into a cavity of the card body, in the individual cavities located at the base of the cavity of the card body in order to substantially fill the individual cavities.

17. The external connector according to claim 16, wherein a plurality of intermediate contact pads are arranged on the inside face of the external connector and respectively connected to the at least one subassembly of the plurality of external metal contact pads or to the contact pads linked to the electronic unit, wherein the intermediate contact pads are respectively located under the metal projections, and wherein the metal projections are formed by a solder material.

18. The external connector according to claim 16, wherein the insulating support has a plurality of apertures between an outside face thereof and an inside face thereof, wherein the apertures of the plurality of apertures are respectively closed by the external pads of the at least one subassembly of the plurality of external metal contact pads on the side of the outside face of the insulating support, and wherein the apertures are substantially filled by respective metal parts, which are respectively extended or surmounted by metal projections of the plurality of metal projections.

19. The external connector according to claim 18, wherein the apertures have a cross-section, in which at least one dimension is larger than 0.5 mm.

20. The external connector according to claim 18, wherein the metal parts and the corresponding metal projections are substantially formed from solder material.

21. The external connector according to claim 16, further comprising an adhesive film on the inside face of the insulating support, wherein the adhesive film has apertures from which the metal projections exit.

* * * * *